US009372582B2

(12) United States Patent
Brunet et al.

(10) Patent No.: US 9,372,582 B2
(45) Date of Patent: Jun. 21, 2016

(54) SELF-CAPACITANCE MEASUREMENT

(75) Inventors: Samuel Brunet, Cowes (GB); Bernard J. Hermes, Southhampton (GB); Trond Jarle Pedersen, Trondheim (NO); Luben Hristov Hristov, Sofia (BG); Shahrooz Shahparnia, Campbell, CA (US); Vivek Pant, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 164 days.

(21) Appl. No.: 13/451,352

(22) Filed: Apr. 19, 2012

(65) Prior Publication Data

US 2013/0278538 A1 Oct. 24, 2013

(51) Int. Cl.
*G06F 3/044* (2006.01)
*H03K 17/96* (2006.01)

(52) U.S. Cl.
CPC ............ *G06F 3/044* (2013.01); *H03K 17/9622* (2013.01); *H03K 2217/960725* (2013.01); *H03K 2217/960745* (2013.01)

(58) Field of Classification Search
CPC ............... G06F 3/044; H03K 17/9622; H03K 2217/960725; H03K 2217/960745
USPC .................... 178/18.06, 18.01; 345/173–174; 324/658, 679, 686; 327/336
See application file for complete search history.

(56) References Cited

U.S. PATENT DOCUMENTS

| | | | | |
|---|---|---|---|---|
| 6,888,536 B2 * | 5/2005 | Westerman | ........... | G06F 3/0235 345/156 |
| 7,129,714 B2 * | 10/2006 | Baxter | ..................... | G01D 5/24 324/658 |
| 7,663,607 B2 | 2/2010 | Hotelling | | |
| 7,875,814 B2 | 1/2011 | Chen | | |
| 7,920,129 B2 | 4/2011 | Hotelling | | |
| 8,031,094 B2 | 10/2011 | Hotelling | | |
| 8,031,174 B2 | 10/2011 | Hamblin | | |
| 8,040,326 B2 | 10/2011 | Hotelling | | |
| 8,049,732 B2 | 11/2011 | Hotelling | | |
| 8,154,310 B1 * | 4/2012 | Maharyta | .............. | G06F 3/0416 324/678 |
| 8,179,381 B2 | 5/2012 | Frey | | |
| 8,400,420 B2 * | 3/2013 | Yang | ........................ | G06F 3/044 178/18.06 |
| 8,519,722 B1 * | 8/2013 | Prendergast | ............ | G06F 3/044 324/658 |
| 2006/0017701 A1 * | 1/2006 | Marten | ................... | G06F 3/044 345/173 |

(Continued)

FOREIGN PATENT DOCUMENTS

WO WO 2012/129247 9/2012

OTHER PUBLICATIONS

U.S. Appl. No. 61/454,936, filed Mar. 21, 2011, Myers.

(Continued)

*Primary Examiner* — Matthew Fry
(74) *Attorney, Agent, or Firm* — Baker Botts L.L.P.

(57) ABSTRACT

In one embodiment, a method includes modifying an amount of charge of a capacitance of a touch sensor. The modified amount of charge resulting in a voltage at the capacitance being a first pre-determined voltage level. The method also includes applying a first pre-determined amount of charge to the capacitance. The application of the first pre-determined amount of charge to the capacitance modifying the voltage at the capacitance from the first pre-determined voltage level to a first charging voltage level. The method also includes determining a first difference between the first charging voltage level and a reference voltage level; and determining whether a touch input to the touch sensor has occurred based on the first difference.

21 Claims, 14 Drawing Sheets

(56) References Cited

U.S. PATENT DOCUMENTS

| | | | | |
|---|---|---|---|---|
| 2006/0273804 | A1* | 12/2006 | Delorme | G01D 5/24 324/658 |
| 2008/0111714 | A1* | 5/2008 | Kremin | G06F 3/044 341/33 |
| 2008/0179112 | A1* | 7/2008 | Qin | G06F 3/036547 178/18.06 |
| 2008/0203977 | A1* | 8/2008 | Raimar | G06F 1/26 320/166 |
| 2009/0153152 | A1* | 6/2009 | Maharyta | G01R 27/2605 324/684 |
| 2009/0243631 | A1* | 10/2009 | Kuang | G01R 27/2605 324/658 |
| 2009/0262095 | A1* | 10/2009 | Kinoshita | G06F 3/044 345/174 |
| 2009/0277696 | A1* | 11/2009 | Reynolds | G06F 3/03547 178/18.06 |
| 2009/0315854 | A1 | 12/2009 | Matsuo | |
| 2010/0020032 | A1* | 1/2010 | Mamba | G06F 3/044 345/173 |
| 2010/0073324 | A1* | 3/2010 | Yang | G06F 3/044 345/174 |
| 2010/0085322 | A1* | 4/2010 | Mamba | G06F 3/044 345/173 |
| 2010/0289769 | A1* | 11/2010 | Watanabe | G06F 3/0418 345/174 |
| 2010/0292945 | A1* | 11/2010 | Reynolds | G06F 3/044 702/65 |
| 2011/0187389 | A1* | 8/2011 | Han | H03K 17/955 324/679 |
| 2011/0261005 | A1* | 10/2011 | Joharapurkar | G06F 3/0418 345/174 |
| 2011/0279131 | A1* | 11/2011 | Kim et al. | 324/679 |
| 2012/0043971 | A1* | 2/2012 | Maharyta | G01R 27/2605 324/658 |
| 2012/0242588 | A1 | 9/2012 | Myers | |
| 2012/0242592 | A1 | 9/2012 | Rothkopf | |
| 2012/0243151 | A1 | 9/2012 | Lynch | |
| 2012/0243719 | A1 | 9/2012 | Franklin | |

OTHER PUBLICATIONS

U.S. Appl. No. 61/454,950, filed Mar. 21, 2011, Lynch.
U.S. Appl. No. 61/454,894, filed Mar. 21, 2011, Rothkopf.

* cited by examiner

SELF-CAPACITANCE MEASUREMENT

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

Herein, reference to a touch sensor may encompass a touch screen, and vice versa, where appropriate. When an object touches or comes within proximity of the surface of the capacitive touch screen, a change in capacitance may occur within the capacitive touch screen at the location of the touch or proximity. A capacitive-touch-sensor controller may process the change in capacitance to determine its position on the capacitive touch screen.

DESCRIPTION OF EXAMPLE EMBODIMENTS

Figure 1:
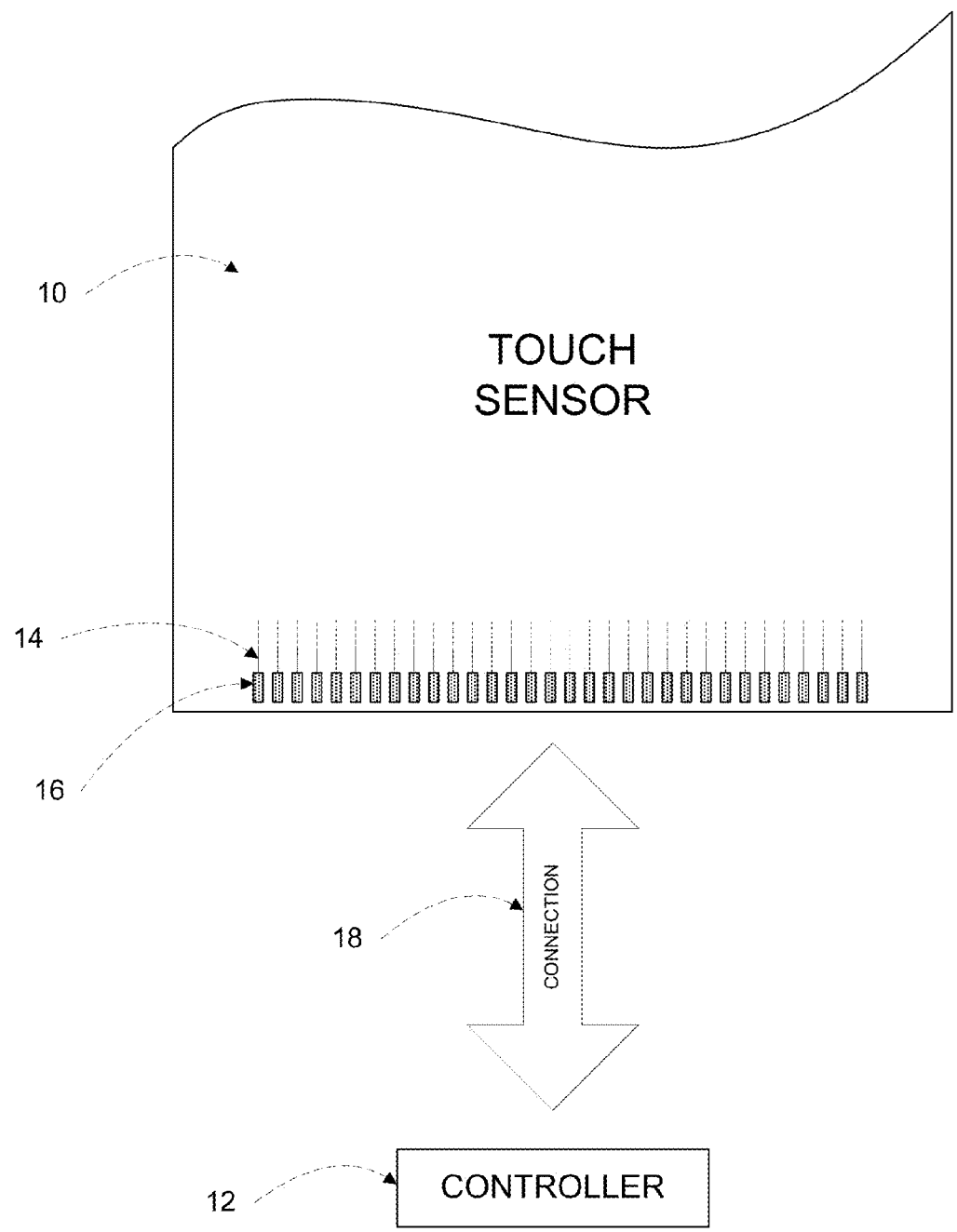
FIG. 1 illustrates an example capacitive touch sensor with an example touch-sensor controller.

FIG. 1 illustrates an example capacitive touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate)

(PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 millimeter (mm); the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 microns ($\mu m$) or less and a width of approximately 10 $\mu m$ or less. As another example, one or more portions of the conductive material may be silver or silver-based and similarly have a thickness of approximately 5 $\mu m$ or less and a width of approximately 10 $\mu m$ or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2A:
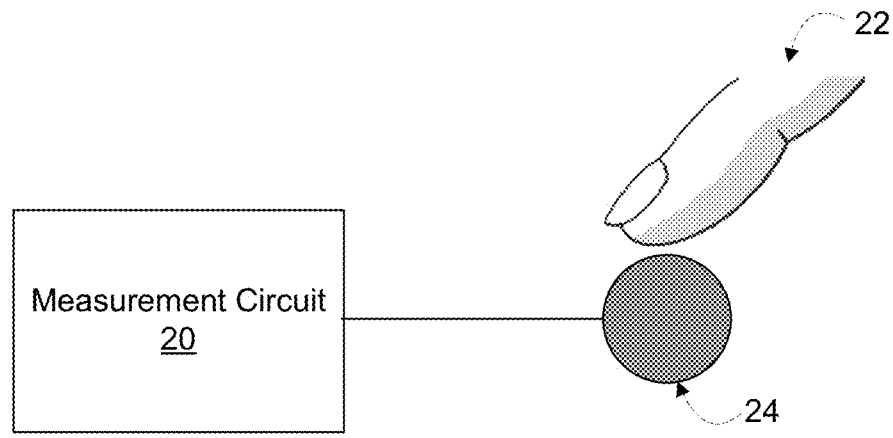
FIGS. 2A-B illustrate a schematic of an example self-capacitance measurement.
Figure 2B:
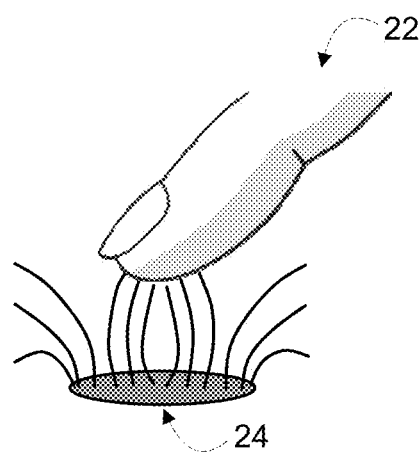

FIGS. 2A-B illustrate a schematic of an example self-capacitance measurement. In the example of FIG. 2A, an electrode 24 of the touch sensor is coupled to a measurement circuit 20. As described below, electrode 24 forms a capacitance to ground that is distributed in the space. In particular embodiments, the capacitance to ground may include multiple elements, such as for example, capacitance of the tracks in the silicon, tracks on the printed circuit board (PCB), electrodes 24 made from conductive material (ITO, copper mesh, etc.), or an object providing a touch input. Electrode 24 has capacitive coupling to ground through the surrounding objects that are galvanically or capacitively connected to ground. As described above, measurement circuit 20 of the touch-sensor controller transmits a drive signal and senses a signal indicative of a touch or proximity input, from for example a finger 22, through electrode 24. In particular embodiments, measurement circuit 20 of the touch-sensor controller generates the drive signal transmitted by electrode 24 and senses the capacitance to ground. The capacitance of the surrounding material includes at least in part, the capacitance between electrode 24 and ground with finger 22 providing the touch or proximity input. As an example and not by way of limitation, the capacitance provided by finger 22 providing the touch or proximity input may add 5-10% of the capacitance sensed by electrode 24.

In the example of FIG. 2B, the drive signal transmitted by electrode 24 generates an electric field that emanates from electrode 24 to a signal ground of the touch sensor. The signal ground is galvanically or capacitively coupled to ground. The presence of finger 22 affects the electric field and in turn the amount of charge sensed at electrode 24 by measurement circuit 20. As finger 22 approaches electrode 24, the capacitance between electrode 24 and ground detected by the measurement circuit 20 increases. Although this disclosure describes the measurement circuit being integrated with a touch-sensor controller, this disclosure contemplates a measurement circuit being a discrete circuit or part of any suitable circuit.

Figure 3:
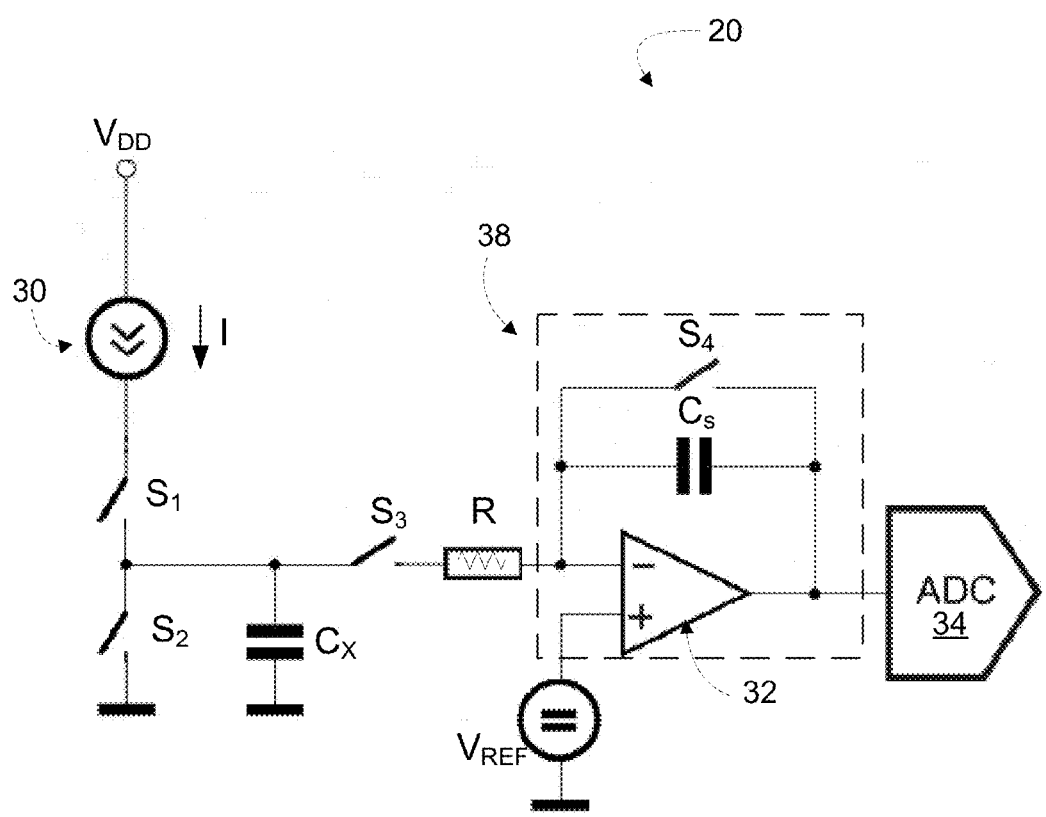
FIG. 3 illustrates an example circuit schematic for self-capacitance measurements.

FIG. 3 illustrates an example circuit schematic for self-capacitance measurements. Self-capacitance measurement circuit 20 determines a change of a touch sensor capacitance schematically illustrated in the example of FIG. 3 by measurement capacitance $C_X$. In particular embodiments, measurement capacitance $C_X$ is formed at least in part between an electrode of the touch sensor and other conductive material of the touch sensor (not shown) capacitively or galvanically coupled to ground. As an example and not by way of limitation, the conductive material of the touch sensor may include portions of tracks, pins, or internal network of the touch sensor. As described above, the electrode of the touch sensor senses the capacitance between the electrode and ground with finger 22 providing the touch or proximity input through the electric field transmitted by the electrode.

Measurement capacitance $C_X$ includes at least a portion of the electrode and is coupled to a current source 30 or ground through switches $S_1$ and $S_2$, respectively. In particular embodiments, current source 30 is configured to generate a current I. In other particular embodiments, switch $S_2$ may be coupled to a voltage other than ground. In particular embodiments, switch $S_3$ couples the electrode portion of measurement capacitance $C_X$ to an integrator circuit 38 through a resistor R. Resistor R may reduce the impact of noise on self-capacitance measurement circuit 20 and stabilize integrator circuit 38. In particular embodiments, integrator circuit 38 includes an operational amplifier (op-amp) 32 coupled to measurement capacitance $C_x$ through switch $S_3$. One terminal of a sampling capacitor $C_S$ is coupled to the negative input of op-amp 32 and the other terminal of sampling capacitor $C_S$ is coupled to the output of op-amp 32. Switch $S_4$ couples one terminal of sampling capacitor $C_S$ to the other terminal. A reference voltage $V_{REF}$ is coupled to the positive input of op-amp 32. The output of integrator circuit 38 is coupled to an analog-to-digital convertor (ADC) 34. In particular embodiments, integrator circuit 38 amplifies the difference between the voltage at measurement capacitance $C_x$ and reference voltage $V_{REF}$. In other particular embodiments, the difference between the voltage at measurement capacitance $C_x$ and reference voltage $V_{REF}$ may be amplified through use of a high-gain amplifier. Although this disclosure describes and illustrates a particular arrangement of particular components for the self-capacitance measurement circuit and integrator circuit, this disclosure contemplates any suitable arrangement of any suitable components for the self-capacitance measurement circuit and integrator circuit.

Figure 4A:
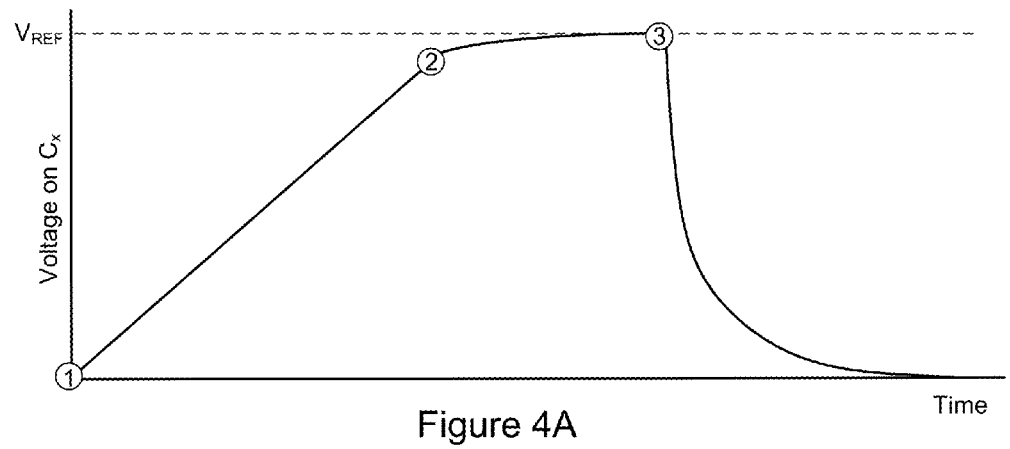
FIGS. 4A-B illustrate a voltage at a measurement capacitance over time for an example self-capacitance measurement.
Figure 4B:
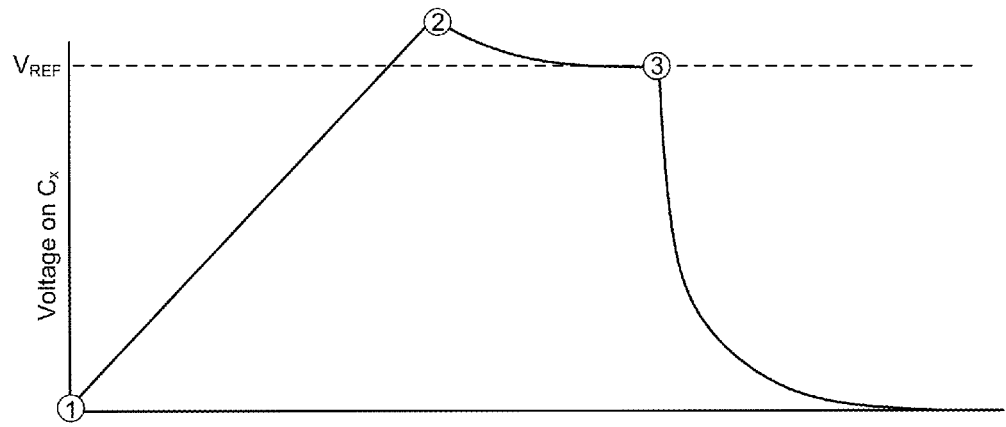

FIGS. 4A-B illustrate a voltage at a measurement capacitance over time for an example self-capacitance measurement. As described above, a touch or proximity input on the electrode of the touch sensor effects the amount of charge, and in turn the voltage, at measurement capacitance $C_X$. The modified amount of charge results in the voltage at measurement capacitance $C_X$ being a pre-determined voltage level when switch $S_2$ is closed prior to time point 1. As an example and not by way of limitation, the pre-determined voltage level at measurement capacitance $C_X$ at time point 1 is ground. Between time points 1 and 2, a pre-determined amount of charge is applied to measurement capacitance $C_X$ through a current source when switch $S_1$ is closed. In particular embodiments, the pre-determined amount of charge is generated by the current source that generates a pre-determined current with switch $S_1$ being closed for a pre-determined amount of time.

In the example of FIG. 4A, at time point 2, the voltage at measurement capacitance $C_X$ after application of the pre-determined amount of charge is a charging voltage level that is below reference voltage level $V_{REF}$. In the example of FIG. 4B, at time point 2, the voltage at measurement capacitance $C_X$ after application of the pre-determined amount of charge is a charging voltage level that is above reference voltage level $V_{REF}$. The charging voltage level at measurement capacitance $C_X$ at time point 2 depends at least in part on the pre-determined amount of charge and whether a touch or proximity input occurs at the electrode of the touch sensor coupled to measurement capacitance $C_X$. As an example and not by way of limitation, when the touch or proximity input occurs, the applied pre-determined amount of charge is divided between measurement capacitance $C_X$ and the capacitance between the finger and the electrode. In this case, the resulting charging voltage level at measurement capacitance $C_X$ is lower compared to the charging voltage level without the touch or proximity input at the electrode. Although this disclosure describes and illustrates particular relationships of the charging voltage level relative to the reference voltage level, this disclosure contemplates any suitable relationship of the charging voltage level relative to the reference voltage level, such as for example, the charging voltage level being above, below, or substantially equal to the reference voltage level.

In particular embodiments, at time point 2, switch $S_3$ is closed thereby modifying the amount of charge of measurement capacitance $C_X$ through the negative terminal of the op-amp. As an example and not by way of limitation, the voltage at the negative terminal of the op-amp is set at reference voltage level $V_{REF}$. Modification of the amount of charge of measurement capacitance $C_x$ modifies the voltage at measurement capacitance $C_X$ from the charging voltage level to reference voltage level $V_{REF}$. In particular embodiments, charge of measurement capacitance $C_X$ is transferred to sampling capacitor $C_S$ of the integrator circuit.

The transferred charge between measurement capacitance $C_X$ and sampling capacitor $C_S$ is integrated by the integrator circuit until time point 3, when the voltage at measurement capacitance $C_X$ is substantially equal to reference voltage level $V_{REF}$. As an example and not by way of limitation, in the example of FIG. 4A, the transfer of charge between measurement capacitance $C_X$ and sampling capacitor $C_S$ increases the voltage at measurement capacitance $C_X$ to reference voltage level $V_{REF}$. As another example, in the example of FIG. 4B, the transfer of charge between measurement capacitance $C_X$ and sampling capacitor $C_S$ decreases the voltage at measurement capacitance $C_X$ to reference voltage level $V_{REF}$. In particular embodiments, the integrator circuit measures the transferred amount of charge that modifies the voltage at measurement capacitance $C_X$ from the charging voltage level to reference voltage level $V_{REF}$. The voltage at sampling capacitor $C_S$ varies by an amount proportional to the amount of transferred charge. Integrating the transferred amount of charge amplifies the difference between the charging voltage level and reference voltage level $V_{REF}$. In particular embodiments, the difference between the charging voltage level and reference voltage level $V_{REF}$ may be measured directly using the ADC output or indirectly through the output of the integrator circuit. A touch or proximity input is determined relative to a calibration voltage difference between measured the charging voltage level and reference voltage level $V_{REF}$ without a touch or proximity input.

TABLE 1 illustrates an example sequence of operations for the example self-capacitance measurement illustrated in FIGS. 4A-B. Steps 1-3 modifies the voltage at the capacitor to a pre-determined voltage level and applies the pre-determined amount of charge to measurement capacitance $C_X$. The application of charge modifies the voltage at measurement capacitance $C_X$ to the charging voltage level. In particular embodiments, the amount of charge may be pre-determined for the pre-determined voltage level, a target charging voltage level, and the capacitance value of measurement capacitance $C_X$. As described above, the charging voltage level depends in part on whether a touch or proximity input is present on the electrode of the touch sensor. Steps 5-9 measures the amount of charge modifying the voltage at measurement capacitance $C_X$ from the charging voltage level to reference voltage level $V_{REF}$, as described above. In particular embodiments, steps 2-9 are performed a number of times corresponding to a burst length. Repetition of applying the pre-determined amount of charge on measurement capacitance $C_X$ and transferring charge to sampling capacitor $C_S$ increases the amount of charge on sampling capacitor $C_S$. Step 11 discharges measurement capacitance $C_X$ by closing switch $S_2$ at time point 3. Although this disclosure describes and illustrates a particular sequence of steps in TABLE 1, this disclosure contemplates any suitable sequence of steps for performing self-capacitance measurements.

TABLE 1

| Step | $S_1$ | $S_2$ | $S_3$ | $S_4$ | Description |
|---|---|---|---|---|---|
| 1 | off | on | off | on | Initial discharge state - all capacitors fully discharged |
| 2 | on | on | off | on | Holding voltage on measurement capacitance $C_X$ to suppress current glitch when coupling current source |
| 3 | on | off | off | on | Apply pre-determined amount of charge to measurement capacitance $C_X$ |
| 4 | | | | | Wait pre-determined amount of time to generate pre-determined amount of charge |
| 5 | off | off | off | on | Disconnect current source from measurement capacitance $C_X$ |
| 6 | off | off | off | off | Prepare integrator circuit to integrate charge |
| 7 | on | off | on | off | Couple measurement capacitance $C_X$ to integrator circuit |
| 8 | | | | | Allow charge transfer to be completed |
| 9 | off | off | off | off | Float sampling capacitor $C_S$ |
| 10 | off | off | off | off | Measure output voltage |
| 11 | off | on | off | on | Return to initial state | on = closed switch
off = open switch

Figure 5A:
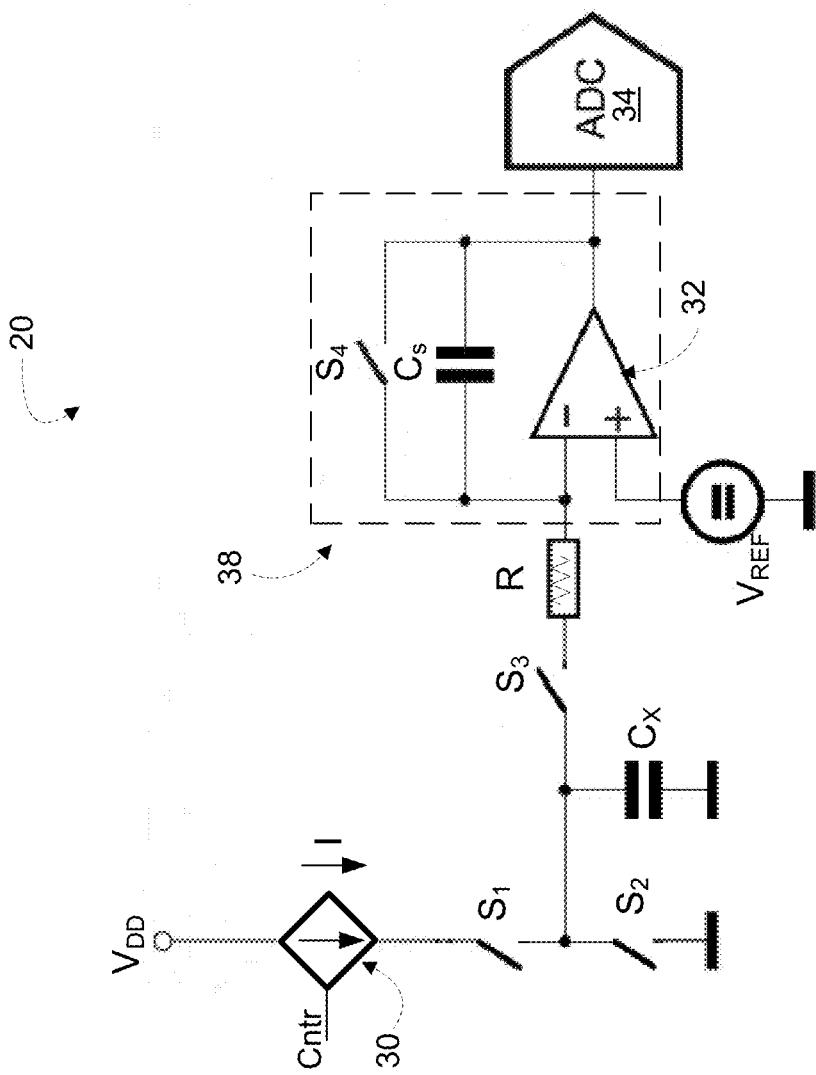
FIGS. 5A-B illustrate an example circuit schematics for self-capacitance measurements with dual charging.
Figure 5B:
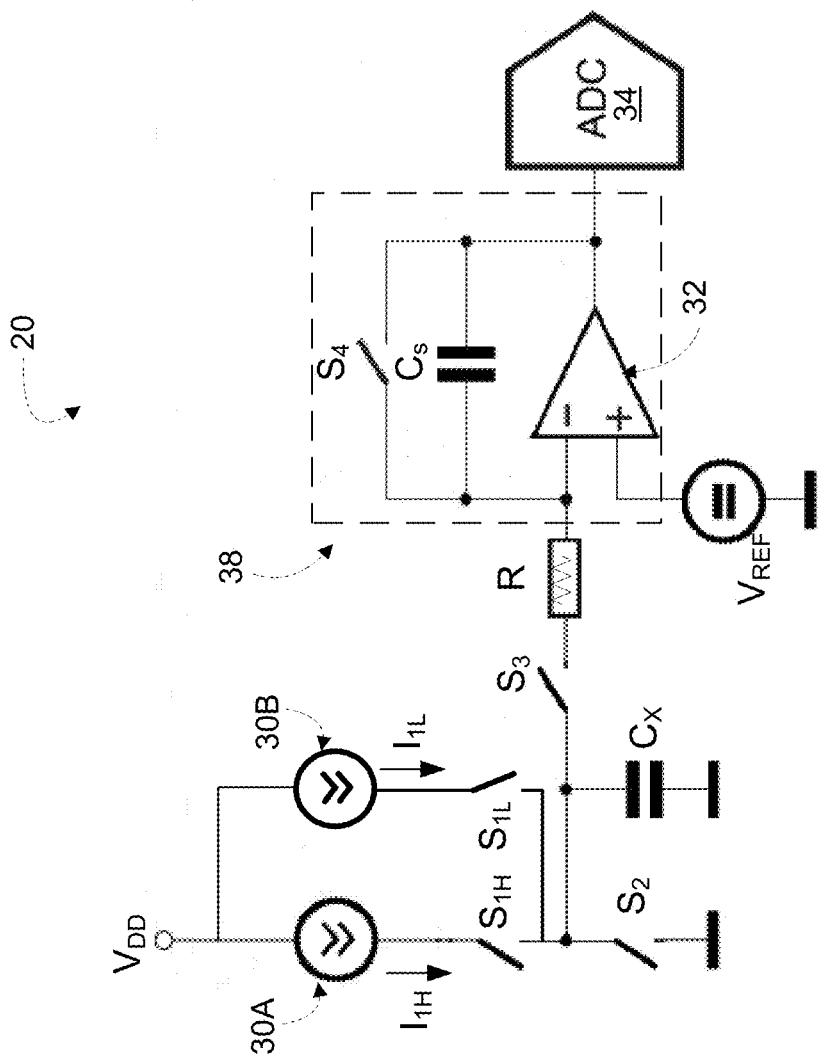

FIGS. 5A-B illustrate an example circuit schematics for self-capacitance measurements with dual charging. In the example of FIG. 5A, self-capacitance measurement circuit 20 applies the pre-determined amount through a controllable-current source. Measurement capacitance $C_X$ is coupled to ground through switch $S_2$ and coupled to controllable-current source 30 through switch $S_1$. In particular embodiments, controllable-current sources 30 is configured to apply adjustable current I to measurement capacitance $C_X$. In particular embodiments, the value of current I may be modified by the touch-sensor controller through control signal Cntr transmitted to controllable-current source 30. Switch $S_3$ couples measurement capacitance $C_X$ to an integrator circuit 38 through a resistor R. The output of integrator circuit 38 is coupled to an analog-to-digital convertor (ADC) 34. Although this disclosure describes and illustrates a particular arrangement of particular components for the self-capacitance measurement circuit and integrator circuit, this disclosure contemplates any suitable arrangement of any suitable components for the self-capacitance measurement circuit and integrator circuit.

In the example of FIG. 5B, self-capacitance measurement circuit 20 applies the pre-determined amount through dual-current sources. The portion of measurement capacitance $C_X$ that includes the electrode is coupled to ground through switch $S_2$. Measurement capacitance $C_X$ is coupled to current sources 30A and 30B through switches $S_{1H}$ and $S_{1L}$. Current sources 30A and 30B are configured to apply currents $I_{1H}$ and $I_{1L}$, to measurement capacitance $C_X$, respectively. In particular embodiments, current $I_{1H}$ is higher than current $I_{1L}$. Switch $S_3$ couples measurement capacitance $C_X$ to an integrator circuit 38 through a resistor R. The output of integrator circuit 38 is coupled to an analog-to-digital convertor (ADC) 34. Although this disclosure describes and illustrates a particular arrangement of particular components for the self-capacitance measurement circuit and integrator circuit, this disclosure contemplates any suitable arrangement of any suitable components for the self-capacitance measurement circuit and integrator circuit.

Figure 5C:
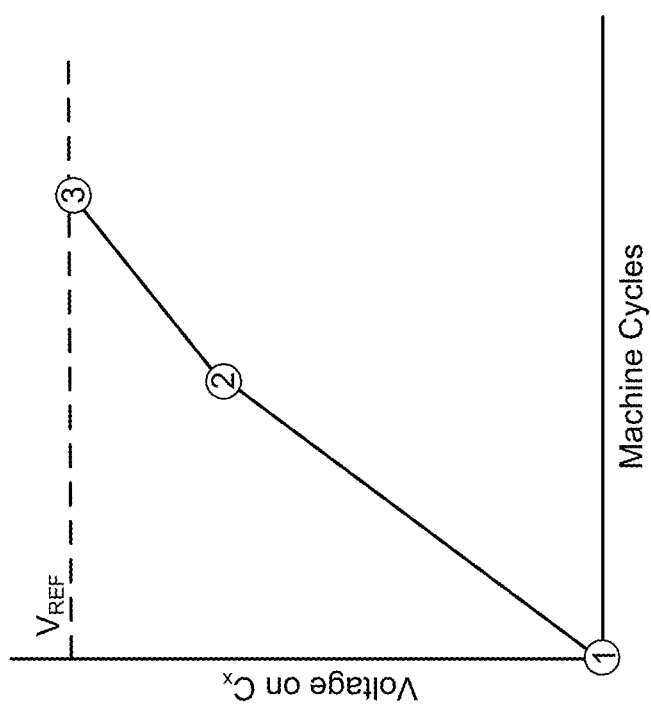
FIG. 5C illustrates a voltage at a measurement capacitance as a function of machine cycles.

FIG. 5C illustrates a voltage at a measurement capacitance as a function of machine cycles for an example self-capacitance measurement with dual-current values. As described above, at time point 1 switch $S_2$ is closed, modifying the amount of charge of measurement capacitance $C_X$ and resulting in the voltage at measurement capacitance $C_X$ being a pre-determined voltage level. Between time points 1 and 3, a pre-determined amount of charge is applied to measurement capacitance $C_X$. In the example of FIG. 5A, the pre-determined current through is applied through controllable-current source 30 when switch $S_1$ is closed. In the example of FIG. 5B, the pre-determined current is applied through current sources 30A and 30B when switches $S_{1L}$ and $S_{1H}$ are closed. An ability to minimize the difference between the charging voltage level and the reference voltage level $V_{REF}$ is determined at least in part by the precision in which the pre-determined amount of charge is applied to measurement capacitance $C_X$.

In particular embodiments, the pre-determined amount of charge is generated by controllable-current source 30 that apply current I when switches $S_1$ is closed for a pre-determined amount of time, as illustrated in the example of FIG. 5A. In particular embodiments, the pre-determined amount of charge is generated by current sources 30A and 30B that apply currents $I_{1H}$ and $I_{1L}$ when switches $S_{1L}$ and $S_{1H}$ are closed for a pre-determined amount of time, as illustrated in the example of FIG. 5B. The resolution of the pre-determined amount of time currents are applied is determined at least in part to a clock frequency of the touch-sensor controller.

For a given clock frequency, the resolution of the pre-determined amount of charge can be determined through adjusting the current I of controllable-current source 30 or use of current sources 30A and 30B that generate differing amounts of current $I_{1H}$ and $I_{1L}$. In particular embodiments, as illustrated in the example of FIG. 5A, the charge of measurement capacitance $C_X$ is modified by application of current I having a first value between time points 1 and 2. Between time points 2 and 3, the charge of measurement capacitance $C_X$ is modified by adjusting current I to a second value that may be less than the first value. In particular embodiments, as illustrated in the example of FIG. 5B, the charge of measurement capacitance $C_X$ is modified by application of currents $I_{1H}$ and $I_{1L}$ between time points 1 and 2. Between time points 2 and 3, switch $S_{1L}$ is opened and the charge of measurement capacitance $C_X$ is modified by application of current $I_{1H}$. At time point 3, the charge is no longer applied to measurement capacitance $C_X$ and the voltage at measurement capacitance $C_X$ is a charging voltage level. Although this disclosure describes and illustrates a particular methods applying a pre-determined amount of current, this disclosure contemplates any suitable methods of applying a pre-determined amount of charge on a capacitor.

Figure 6:
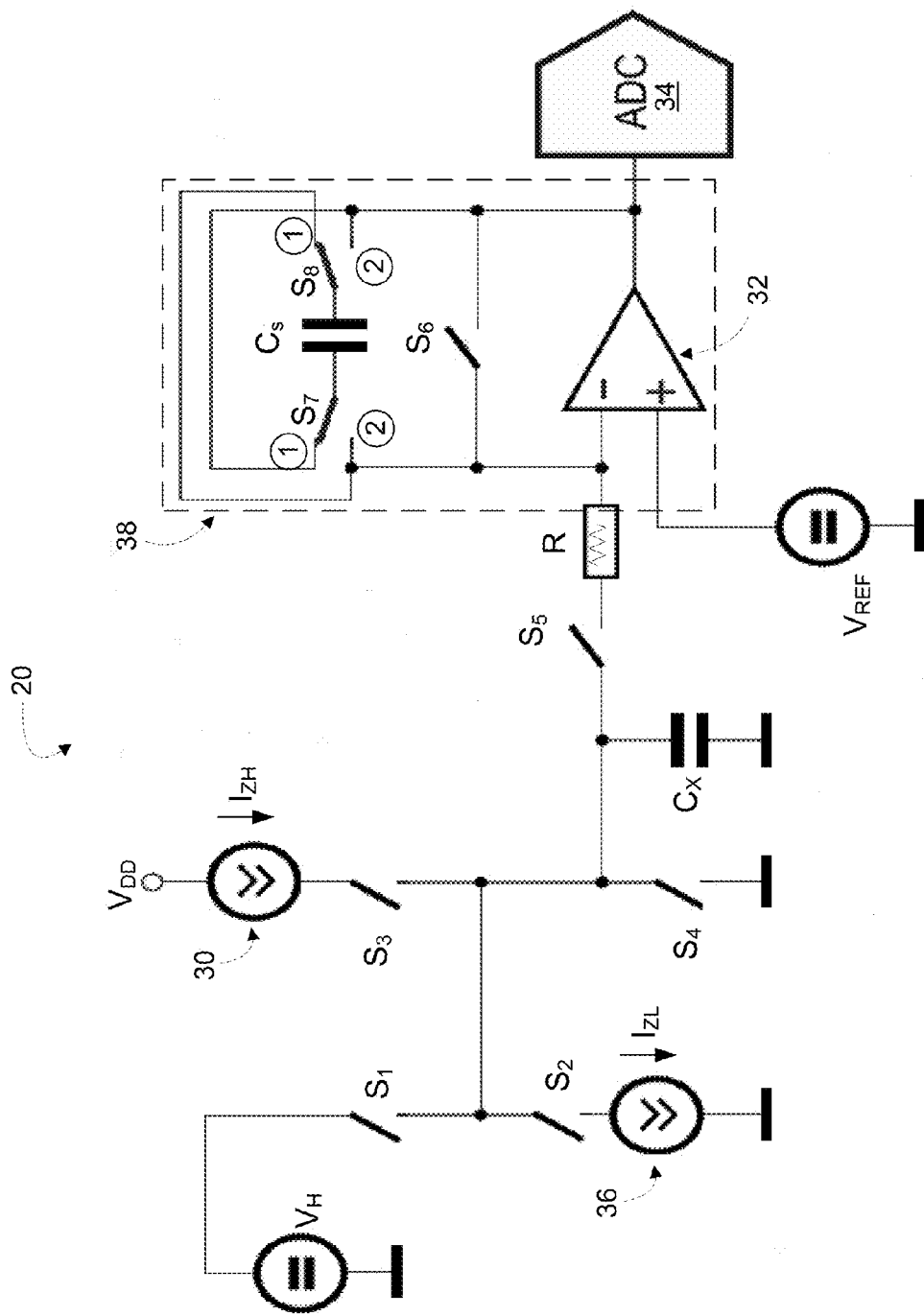
FIG. 6 illustrates an example circuit schematic for a self-capacitance measurement with low-frequency (LF) noise suppression.

FIG. 6 illustrates an example circuit schematic for self-capacitance measurements with LF noise suppression. Self-capacitance measurement circuit 20 determines a change of a touch sensor capacitance schematically illustrated in the example of FIG. 6 by measurement capacitance $C_X$. As described above, measurement capacitance $C_X$ may be formed in part between an electrode of the touch sensor and other surrounding conductive material of the touch sensor (not shown) capacitively or galvanically coupled to ground.

As an example and not by way of limitation, measurement capacitance $C_X$ may include some intrinsic capacitance associated with the design of the touch sensor. Measurement capacitance $C_X$ includes at least a portion of the electrode and is coupled to a voltage source $V_H$ or current source 36 through switches $S_1$ and $S_2$, respectively. Measurement capacitance $C_X$ is coupled to a second current source 30 or ground through switches $S_3$ and $S_4$, respectively. In particular embodiments, current source 30 and current source 36 are configured to generate currents $I_{ZH}$ and $I_{ZL}$, respectively. Switch $S_5$ couples measurement capacitance $C_X$ to an integrator circuit 38 through a resistor R.

In particular embodiments, integrator circuit 38 includes op-amp 32 coupled to measurement capacitance $C_X$ through switch $S_5$. One terminal of a sampling capacitor $C_S$ is coupled to the negative input of op-amp 32 and the other terminal of sampling capacitor $C_S$ is coupled to the output of op-amp 32. Switch $S_6$ couples one terminal of sampling capacitor $C_S$ to the other terminal. In particular embodiments, a reference voltage $V_{REF}$ is coupled to the positive input of op-amp 32. The output of integrator circuit 38 is coupled to ADC 34.

Switches $S_7$ and $S_8$ have two positions that determine the configuration of sampling capacitor $C_S$ with respect to the negative input and the output of op-amp 32. With switches $S_7$ and $S_8$ in a first position, the terminals of sampling capacitor $C_S$ are coupled in a particular fashion to the negative input and the output of op-amp 32. With switches $S_7$ and $S_8$ in a second position, the terminals of sampling capacitor $C_S$ are coupled in an opposite fashion to the configuration of the first position. Reversing the configuration of the terminals of sampling capacitor $C_S$ between measurements acts to subtract one measurement from the other measurement by inverting the direction charge is transferred from measurement capacitance $C_X$ to sampling capacitor $C_S$. As described below, inverting the polarity of one measurement and subtracting an initial and subsequent measurement substantially suppresses LF noise common to both measurements. Although this disclosure describes and illustrates a particular arrangement of particular components for the self-capacitance measurement circuit and integrator circuit, this disclosure contemplates any suitable arrangement of any suitable components for the self-capacitance measurement circuit and integrator circuit. Moreover, subtracting the subsequent measurement from the initial measurement may be performed in the analog domain or in the digital domain where the signals are measured and subtracted mathematically.

Figure 7A:
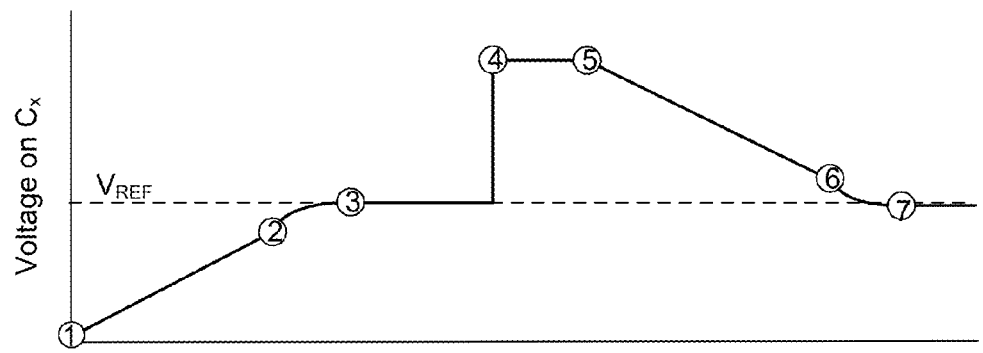
FIGS. 7A-C illustrate a voltage at a measurement capacitance over time for an example self-capacitance measurement with LF noise suppression.
Figure 7B:
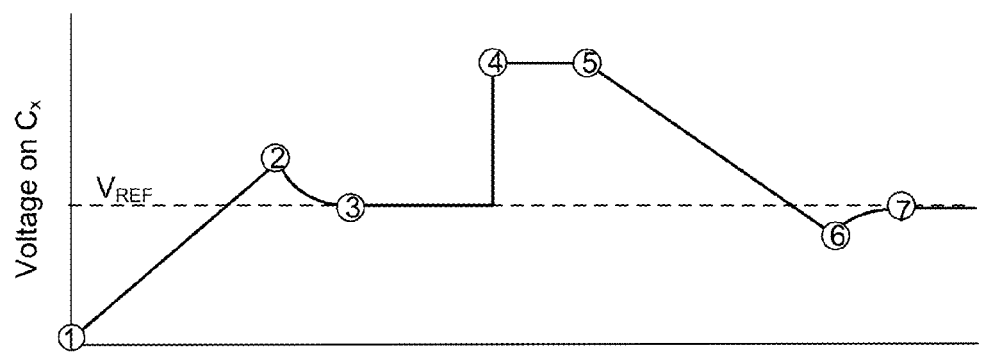
Figure 7C:

FIGS. 7A-C illustrate a voltage at a measurement capacitance over time for an example self-capacitance measurement with LF noise suppression. As described above, a touch or proximity input on the electrode of the touch sensor effects the amount of charge, and in turn the voltage, at measurement capacitance $C_X$ formed at least in part from an electrode of the touch sensor. The modified amount of charge results in the voltage at measurement capacitance $C_X$ being a pre-determined voltage when switch $S_4$ is closed at time point 1. As an example and not by way of limitation, the pre-determined voltage at measurement capacitance $C_X$ at time point 1 is ground. Between time points 1 and 2, a pre-determined amount of charge is applied to measurement capacitance $C_X$ through current source 30 when switch $S_3$ is closed. In particular embodiments, the pre-determined amount of charge is applied through current source 30 that generates a pre-determined current $I_{ZH}$ with switch $S_3$ being closed for a pre-determined amount of time.

In the example of FIG. 7A, at time point 2, the voltage at measurement capacitance $C_X$ after application of the pre-determined amount of charge is a voltage level that is lower than reference voltage level $V_{REF}$. In the example of FIG. 7B, at time point 2, the voltage is a voltage level that is higher than reference voltage level $V_{REF}$. As described above, the charging voltage level, i.e. the voltage on measurement capacitance $C_X$ after application of the pre-determined amount of charge, at time point 2 depends in part on the pre-determined amount of charge and whether a touch or proximity input occurs at the electrode of the touch sensor.

At time point 2, switch $S_5$ coupling measurement capacitance $C_X$ to the negative input of the op-amp is closed, thereby modifying the amount of charge of measurement capacitance $C_x$. As an example and not by way of limitation, the voltage at the negative terminal of the op-amp is set at reference voltage level $V_{REF}$. As described above, modification of the amount of charge of measurement capacitance $C_X$ modifies the voltage at measurement capacitance $C_X$ from the charging voltage level to reference voltage level $V_{REF}$. In particular embodiments, charge is transferred between measurement capacitance $C_X$ and sampling capacitor $C_S$ of the integrator circuit. As an example and not by way of limitation, the voltage at the negative terminal of op-amp 32 is set at reference voltage level $V_{REF}$.

As an example and not by way of limitation, in the example of FIG. 7A, the transfer of charge between measurement capacitance $C_X$ and sampling capacitor $C_S$ increases the voltage at measurement capacitance $C_X$ from the charging voltage level to reference voltage level $V_{REF}$. As another example, in the example of FIG. 7B, the transfer of charge between measurement capacitance $C_X$ and sampling capacitor $C_S$ decreases the voltage at measurement capacitance $C_X$ from the charging voltage level to reference voltage level $V_{REF}$.

The transferred charge is integrated by the integrator circuit until time point 3, when the voltage at measurement capacitance $C_X$ is substantially equal to reference voltage $V_{REF}$. In particular embodiments, the integrator circuit measures the transferred amount of charge that modifies the voltage at measurement capacitance $C_X$ from the charging voltage level to reference voltage $V_{REF}$. In particular embodiments, reference voltage $V_{REF}$ is substantially equal to half a power supply voltage. The voltage at sampling capacitor $C_S$ varies by an amount proportional to the amount of transferred charge.

At time point 4, the amount of charge of measurement capacitance $C_X$ is modified by closing switch $S_1$, resulting in the voltage at measurement capacitance $C_X$ being voltage $V_H$. As an example and not by way of limitation, voltage $V_H$ is a power supply voltage of the touch sensor. Another pre-determined amount of charge is applied to measurement capacitance $C_X$ through the electrode of the touch sensor by opening switch $S_1$ and closing switch $S_2$ between time point 5 to time point 6. As an example and not by way of limitation, the other pre-determined amount of charge is generated by current source 36 configured to provide a pre-determined current $I_{ZL}$ with switch $S_2$ being closed for a pre-determined amount of time. In particular embodiments, the polarity of pre-determined current $I_{ZH}$ is opposite the polarity of pre-determined current $I_{ZL}$. In the example of FIG. 7A, at time point 6, the voltage at measurement capacitance $C_X$ after application of the pre-determined amount of charge is a voltage level that is higher than reference voltage level $V_{REF}$. In the example of FIG. 7B, at time point 6, the voltage measurement capacitance $C_X$ is a voltage level that is lower than reference voltage level $V_{REF}$. Although this disclosure describes and illustrates particular differences between the charging voltage levels relative to the reference voltage level, such as for example higher or lower relative to the reference voltage, this disclosure contemplates any suitable difference between for the charging voltage levels relative to the reference voltage level, including for example charging voltage levels that are substantially equal to the reference voltage.

At time point 6, switch $S_5$ coupling a electrode portion of measurement capacitance $C_X$ to the negative input of the op-amp is closed, thereby modifying the amount of charge of measurement capacitance $C_X$, as described above. Modification of the amount of charge of measurement capacitance $C_X$ modifies the voltage at measurement capacitance $C_X$ from the charging voltage level to reference voltage level $V_{REF}$. In particular embodiments, charge is transferred between measurement capacitance $C_X$ and sampling capacitor $C_S$ of the integrator circuit. Modification of the amount of charge of measurement capacitance $C_X$ modifies the voltage at measurement capacitance $C_X$ from the second charging voltage level to reference voltage level $V_{REF}$. As an example and not by way of limitation, in the example of FIG. 7A, the transfer of charge between measurement capacitance $C_X$ and sampling capacitor $C_S$ decreases the voltage at measurement capacitance $C_X$ from the second charging voltage level to reference voltage level $V_{REF}$. As another example, in the example of FIG. 7B, the transfer of charge between measurement capacitance $C_X$ and sampling capacitor $C_S$ increases the voltage at measurement capacitance $C_X$ from the second charging voltage level to reference voltage level $V_{REF}$.

The difference between the first charging voltage and reference voltage level $V_{REF}$, illustrated by time points 2 and 3, has an opposite polarity to the second difference between the second charging voltage level and reference voltage level $V_{REF}$, illustrated by time points 6 and 7. As example and not by way of limitation, in the example of FIG. 7A, the difference between the first charging voltage level at time 2 and reference voltage level $V_{REF}$ at time 3 is positive, i.e. reference voltage level $V_{REF}$ is higher than the first charging voltage level. The difference between the second charging voltage level at time 6 and reference voltage level $V_{REF}$ at time 7 is negative, i.e. reference voltage level $V_{REF}$ is lower than the first charging voltage level. In particular embodiments, LF noise corrupting the signal from the electrode may occur during time points 1-3 and during time points 5-7. During time points 1-3 and during time points 5-7, the LF noise has the same polarity and amplitude, while the measured differences during the same time periods have same amplitude but opposite polarity, as described above. Subtracting the signal acquired during time periods 1-3 from the signal acquired during time periods 5-7 substantially suppresses LF noise common to both signals and retains the measured signal.

In the example of FIG. 7C, the absolute voltage of the sampling capacitor is illustrated as a function of time. Between time points 2 and 3, the absolute voltage at sampling capacitor $C_S$ increases as a function of the voltage difference between the first charging voltage level and reference voltage level $V_{REF}$ at measurement capacitance $C_X$. As an example and not by way of limitation, the voltage difference between the first charging voltage level and reference voltage $V_{REF}$ at measurement capacitance $C_X$ is proportional to the difference between the pre-determined voltage and the reference voltage level $V_{REF}$, and the ratio between measurement capacitance $C_X$ and sampling capacitor $C_S$. The voltage at sampling capacitor $C_S$ remains steady when charge is not being transferred between measurement capacitance $C_X$ and sampling capacitor $C_S$ until time point 6. Between time points 6 and 7, the absolute voltage at sampling capacitor $C_S$ increases as a function of the voltage difference between the second charging voltage level and reference voltage $V_{REF}$ at measurement capacitance $C_X$. The increase in the absolute voltage at sampling capacitor $C_S$ is due to charge transfer between measurement capacitance $C_X$ and sampling capacitor $C_S$.

The example self-capacitance measurement circuit of FIG. 6 may be configured to perform a double-integration measurement. In the example of FIG. 6, sampling capacitor $C_S$ of the integrator circuit is configured through switches $S_7$ and $S_8$ that have a first and second position. By toggling the position of switches $S_7$ and $S_8$, the integrator circuit subtracts the difference between the second charging voltage level and reference voltage level $V_{REF}$. As described above, this contribution from the charge transferred between measurement capacitance $C_X$ and sampling capacitor $C_S$ is subtracted from the amount of charge of sampling capacitor $C_S$ from the previous charge transfer, as illustrated in the example of FIG. 6C.

LF noise may corrupt the input detected through the electrode of the touch sensor. As an example and not by way of limitation, LF noise may originate from the power supply of the touch sensor operating at 50-60 Hz. As another example, LF noise may have a large amplitude, such as for example, of 100 volts or more. During a transfer of charge, a LF noise source may inject an amount of charge on measurement capacitance $C_X$. Depending on whether on the LF noise is positioned on the falling or rising slope of the LF waveform, the injected charge adds or subtracts charge into measurement capacitance $C_X$ as an offset to the modification of charge of measurement capacitance $C_X$ performed by the measurement circuit. In the case when sequential measurements are performed, the charge added or subtracted by the LF noise source appears as common-mode shift of the signals from measurement capacitance $C_X$. Depending on the measurement frequency, the common-mode shift may modify the amplitude or polarity of signals from measurement capacitance $C_X$.

LF noise present at time points 2 and 3 and at time points 6 and 7 is observed as a common-mode offset in both measurements. In measurements performed within a relatively short period of time, the induced noise has the same polarity and amplitude, while the measured signals have same amplitude and opposite polarity. As described above, common-mode offsets may have a frequency that is lower than a measurement frequency and cause signal fluctuation. The noise offset of the self-capacitance measurement is suppressed by inverting the second voltage difference and associated noise component and subtracting the signal with the first voltage difference through configuration of switches $S_7$ and $S_8$. To avoid the cancellation of the measured signal, the polarity of the signal of one of the measurements may be inverted at measurement capacitance $C_X$ prior to the subtraction of signals. As described above, the touch or proximity input is determined relative to a calibration difference of the first and second charging voltage levels and reference voltage level $V_{REF}$ without a touch or proximity input.

TABLE 2 illustrates an example sequence of operations for the example self-capacitance measurement illustrated in FIGS. 7A-C. Steps 2-4 apply charge to measurement capacitance $C_X$ that modifies the voltage at measurement capacitance $C_X$ to the charging voltage level. As described above, the charging voltage level depends in part on whether a touch or proximity input is present on the electrode of the touch sensor. Steps 5-7 detect charge modifying the voltage at measurement capacitance $C_X$ from the charging voltage level to reference voltage level $V_{REF}$, as described above. Steps 6-7 apply charge to measurement capacitance $C_X$ that modifies the voltage at measurement capacitance $C_X$ to the second charging voltage level. Steps 8-10 detect charge modifying the voltage at measurement capacitance $C_X$ from the second charging voltage level to reference voltage level $V_{REF}$. In particular embodiments, steps 2-11 are performed a number of times corresponding to a burst length. Repetition of applying the pre-determined amount of charge on measurement capacitance $C_X$ and transferring charge to sampling capacitor $C_S$ increases the amount of charge on sampling capacitor $C_S$. Although this disclosure describes and illustrates a particular sequence of steps in TABLE 2, this disclosure contemplates any suitable sequence of steps for performing self-capacitance measurements with LF noise suppression.

TABLE 2

| Step | $S_1$ | $S_2$ | $S_3$ | $S_4$ | $S_5$ | $S_6$ | $S_7$ | $S_8$ | Description |
|---|---|---|---|---|---|---|---|---|---|
| 1 | off | off | off | on | off | on | 1 | 1 | Initial discharge state-sampling capacitor $C_S$ discharged |
| 2 | off | off | on | on | off | off | 1 | 1 | Couple current source to measurement capacitance $C_X$ and allow current to settle |
| 3 | off | off | on | off | off | off | 1 | 1 | Redirect current to measurement capacitance $C_X$ for pre-determined amount of time |
| 4 | off | off | off | off | on | off | 1 | 1 | Integrating charge from charging voltage level to reference voltage level $V_{REF}$ |
| 5 | off | off | off | off | off | off | 1 | 1 | End of charge integration |
| 6 | on | on | off | off | off | off | 1 | 1 | Modify charge on measurement capacitance $C_X$ resulting in pre-determined voltage |
| 7 | off | on | off | off | off | off | 1 | 1 | Apply second current to measurement capacitance $C_X$ for second pre-determined amount of time |
| 8 | off | off | off | off | off | off | 2 | 2 | Switch polarity of integrator circuit |
| 9 | off | off | off | off | on | off | 2 | 2 | Integrating charge from second charging voltage level to reference voltage level $V_{REF}$ |
| 10 | off | off | off | off | off | off | 2 | 2 | End of charge integration; measure output of integrator circuit |
| 11 | off | off | off | on | off | on | 1 | 1 | Discharge all capacitors | on = closed switch
off = open switch

Figure 8:
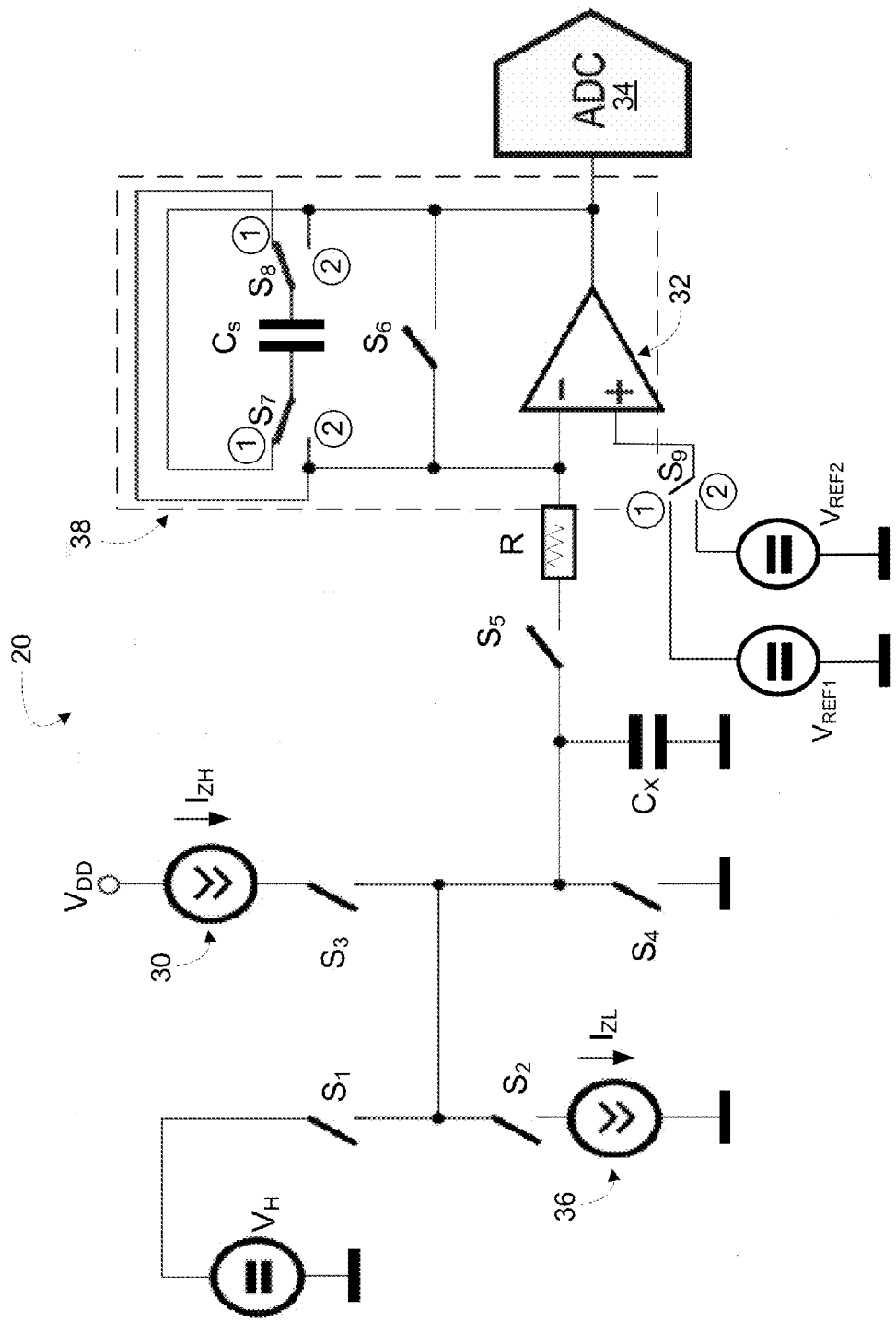
FIG. 8 illustrates an example circuit schematic for self-capacitance measurements with LF noise suppression using dual reference voltages.

FIG. 8 illustrates an example circuit schematic for self-capacitance measurements with LF noise suppression using dual reference voltages. Self-capacitance measurement circuit 20 with LF noise suppression using dual reference voltages determines a change of a touch sensor capacitance schematically illustrated in the example of FIG. 8 by measurement capacitance $C_X$. Measurement capacitance $C_X$ includes at least a portion of the electrode and is coupled to a voltage source $V_H$ or current source 36 through switches $S_1$ and $S_2$, respectively. Measurement capacitance $C_X$ is coupled to a second current source 30 or ground through switches $S_3$ and $S_4$, respectively. In particular embodiments, current source 30 and current source 36 are configured to generate currents $I_{ZH}$ and $I_{ZL}$, respectively.

Switch $S_5$ couples the electrode portion of measurement capacitance $C_X$ to an integrator circuit 38 through resistor R. One terminal of a sampling capacitor $C_S$ is coupled to the negative input of op-amp 32 of integrator circuit 38 and the other terminal of sampling capacitor $C_S$ is coupled to the output of op-amp 32. Switch $S_6$ couples one terminal of sampling capacitor $C_S$ to the other terminal. In particular embodiments, reference voltages $V_{REF1}$ and $V_{REF2}$ are coupled to the positive input of op-amp 32 through switch $S_9$. Switch $S_9$ has two positions that determine which reference voltage level $V_{REF1}$ and $V_{REF2}$ is transmitted to the positive terminal of op-amp 32. The output of integrator circuit 38 is coupled to ADC 34. As an example and not by way of limitation, integrator circuit amplifies the voltage at measurement capacitance $C_X$. As another example, a high-gain op-amp may be used to amplify the voltage at measurement capacitance $C_X$.

Switches $S_7$ and $S_8$ have two positions that determine the configuration of sampling capacitor $C_S$ with respect to the negative input and the output of op-amp 32. With switches $S_7$ and $S_8$ in a first position, the terminals of sampling capacitor $C_S$ are coupled in a particular fashion to the negative input and the output of op-amp 32. With switches $S_7$ and $S_8$ in a second position, the terminals of sampling capacitor $C_S$ are coupled in an opposite fashion to the configuration of the first position. Although this disclosure describes and illustrates a particular arrangement of particular components for the self-capacitance measurement circuit and integrator circuit, this disclosure contemplates any suitable arrangement of any suitable components for the self-capacitance measurement circuit and integrator circuit.

Figure 9A:
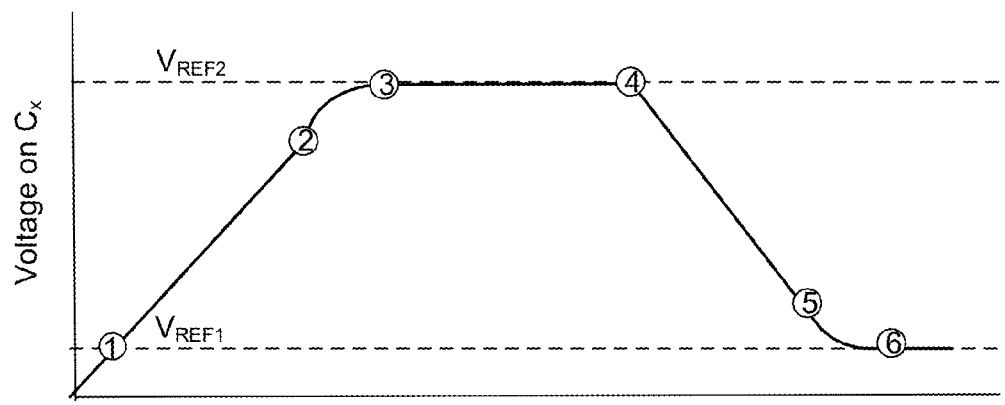
FIGS. 9A-C illustrate a voltage at a measurement capacitance over time for an example self-capacitance measurement with LF noise suppression using dual reference voltage levels.
Figure 9B:
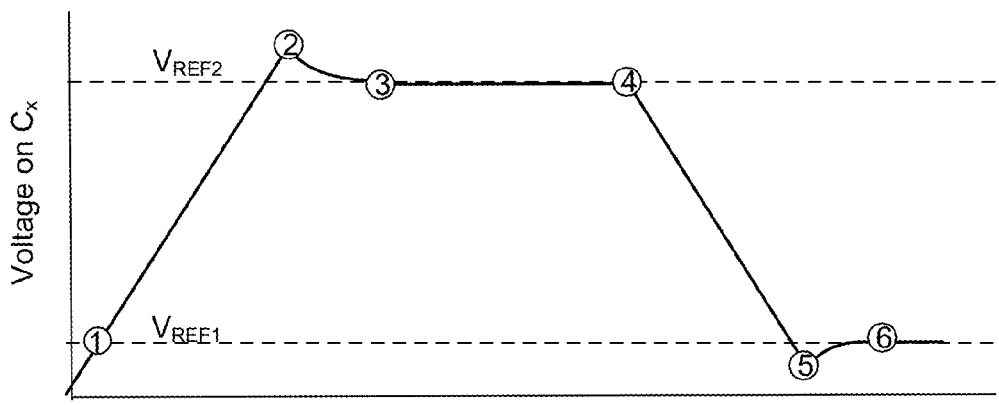
Figure 9C:
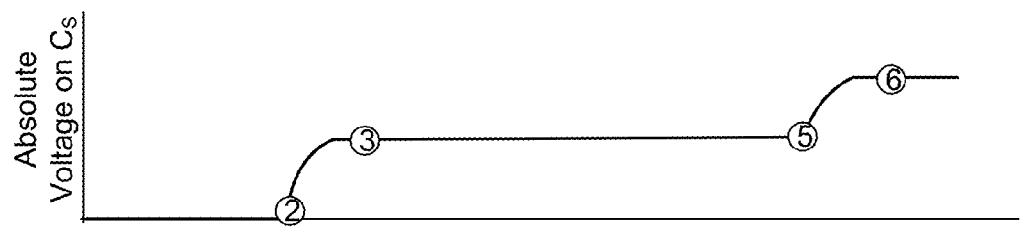

FIGS. 9A-C illustrate a voltage at a measurement capacitance over time for an example self-capacitance measurement with LF noise suppression using dual reference voltage levels. As described above, the amount of charge is modified of measurement capacitance $C_X$ when switch $S_4$ is closed at time point 1. Modification of the amount of charge from closing switch $S_4$ results in a the voltage at measurement capacitance $C_X$ being a pre-determined voltage level. Between time points 1 and 2, a pre-determined amount of charge is applied to measurement capacitance $C_X$ through current source 30 when switch $S_3$ is closed. In particular embodiments, the pre-determined amount of charge is generated by current source 30 that generates a pre-determined current $I_{ZH}$ with switch $S_3$ being closed for a pre-determined amount of time.

In the example of FIG. 9A, at time point 2, the voltage at measurement capacitance $C_X$ after application of the pre-determined amount of charge is a voltage level that is below reference voltage $V_{REF2}$. In the example of FIG. 9B, at time point 2, the voltage is a voltage level that is above reference voltage level $V_{REF2}$. As described above, the charging voltage level at measurement capacitance $C_X$ at time point 2 depends in part on the pre-determined amount of charge and whether a touch or proximity input occurs at the electrode of the touch sensor coupled to measurement capacitance $C_X$.

At time point 2, switch $S_5$ coupling measurement capacitance $C_X$ to the negative input of the op-amp is closed, thereby modifying the amount of charge of measurement capacitance $C_X$, as described above. As an example and not by way of limitation, the voltage at the negative terminal of op-amp 32 is set at reference voltage level $V_{REF2}$ by toggling switch $S_9$ to a second position. Modification of the amount of charge of measurement capacitance $C_X$ modifies the voltage at measurement capacitance $C_X$ from the charging voltage level to reference voltage level $V_{REF2}$. In particular embodiments, charge is transferred between sampling capacitor $C_S$ of the integrator circuit and measurement capacitance $C_X$. Modification of the amount of charge of measurement capacitance $C_X$ results the voltage at measurement capacitance $C_X$ being modified from the charging voltage level to reference voltage level $V_{REF2}$. As an example and not by way of limitation, in the example of FIG. 9A, modification of the amount of charge increases the voltage at measurement capacitance $C_X$ from the charging voltage level to reference voltage level $V_{REF2}$. As another example, in the example of FIG. 9B, modification of the amount of charge decreases the voltage at measurement capacitance $C_X$ from the charging voltage level to reference voltage level $V_{REF2}$.

The charge from measurement capacitance $C_X$ is integrated by the integrator circuit until time point 3, when the voltage at measurement capacitance $C_X$ is substantially equal to reference voltage level $V_{REF2}$. A second pre-determined amount of charge is applied to measurement capacitance $C_X$ by closing switch $S_2$ between time point 4 to time point 5. As an example and not by way of limitation, the other pre-determined amount of charge is generated by the current source configured to provide a pre-determined current $I_{ZL}$ with switch $S_2$ being closed for a pre-determined amount of time. In the example of FIG. 9A, at time point 5, the voltage at measurement capacitance $C_X$ after application of the pre-determined amount of charge is a voltage level that is above reference voltage level $V_{REF1}$. In the example of FIG. 9B, at time point 5, the voltage measurement capacitance $C_X$ is a voltage level that is below reference voltage level $V_{REF1}$.

The voltage at the negative terminal of op-amp 32 is set at reference voltage $V_{REF1}$ by toggling switch $S_9$ to a first position. In particular embodiments, reference voltage level $V_{REF1}$ At time point 5, switch $S_5$ is closed, thereby coupling measurement capacitance $C_X$ to the negative input of the op-amp and modifying the amount of charge of measurement capacitance $C_X$, as described above. Modification of the amount of charge of measurement capacitance $C_X$ modifies the voltage at measurement capacitance $C_X$ from the second charging voltage level to reference voltage $V_{REF1}$. In particular embodiments, charge is transferred between measurement capacitance $C_X$ and sampling capacitor $C_S$ of the integrator circuit. Modification of the amount of charge of measurement capacitance $C_X$ modifies the voltage at measurement capacitance $C_X$ from the second charging voltage level to reference voltage level $V_{REF1}$. In particular embodiments, charge of measurement capacitance $C_X$ is transferred to sampling capacitor $C_S$ of the integrator circuit. As an example and not by way of limitation, in the example of FIG. 9A, the transfer of charge between measurement capacitance $C_X$ and sampling capacitor $C_S$ decreases the voltage at measurement capacitance $C_X$ from the second charging voltage level to reference voltage level $V_{REF1}$. As another example, in the example of FIG. 9B, the transfer of charge between measurement capacitance $C_X$ and sampling capacitor $C_S$ increases the voltage at measurement capacitance $C_X$ from the second charging voltage level to reference voltage level $V_{REF1}$.

The difference between the first charging voltage level and reference voltage level $V_{REF}$, illustrated by time points 2 and 3, has an opposite polarity to the second difference between the second charging voltage level and reference voltage level $V_{REF1}$, illustrated by time points 6 and 7. As example and not by way of limitation, in the example of FIG. 9A, the difference between the first charging voltage level at time 2 and reference voltage $V_{REF1}$ at time 3 is positive, i.e. reference voltage level $V_{REF2}$ is higher than the first charging voltage level. The difference between the second charging voltage level at time 6 and reference voltage $V_{REF1}$ at time 7 is negative, i.e. reference voltage level $V_{REF}$ is lower than the first charging voltage level. Although this disclosure describes and illustrates particular differences between the charging voltage levels relative to the reference voltage level, such as for example higher or lower relative to the reference voltage, this disclosure contemplates any suitable difference between for the charging voltage levels relative to the reference voltage level, including for example charging voltage levels that are substantially equal to the reference voltage.

In the example of FIG. 9C, the absolute voltage at the sampling capacitor is illustrated as a function of time. Between time points 2 and 3, the absolute voltage at sampling capacitor $C_S$ increases as a function of the voltage difference between the first charging voltage level and reference voltage level $V_{REF2}$ at measurement capacitance $C_X$. The voltage at sampling capacitor $C_S$ remains steady when charge is not being transferred between measurement capacitance $C_X$ and sampling capacitor $C_S$ until time point 6. Between time points 6 and 7, the absolute voltage at sampling capacitor $C_S$ increases as a function of the voltage difference between the second charging voltage level and reference voltage $V_{REF1}$ at measurement capacitance $C_X$. The increase in the absolute voltage at sampling capacitor $C_S$ is due to charge transfer between measurement capacitance $C_X$ and sampling capacitor $C_S$.

The example differential self-capacitance measurement circuit of FIG. 8 may be configured to perform a self-capacitance measurement with LF noise suppression. In the example of FIG. 8, sampling capacitor $C_S$ of the integrator circuit is configured through switches $S_7$ and $S_8$ that have a first and second position. By toggling the position of switches $S_7$ and $S_8$, the direction of the integrator circuit inverts the voltage difference between the second charging voltage level and reference voltage level $V_{REF}$ at measurement capacitance $C_X$. This contribution from the charge transferred between measurement capacitance $C_X$ and sampling capacitor $C_S$ is summed with the charge of sampling capacitor $C_S$ from the previous charge transfer, as illustrated in the example of FIG. 9C. In particular embodiments, LF noise may corrupt the signal detected through the electrode of the touch sensor. As described above, LF noise present in the difference measured at time points 2 and 3 and at time points 5 and 6 is seen as a common-mode offset present in the voltage difference of both measurements. The noise offset of the self-capacitance measurement is suppressed by inverting the second voltage difference and associated noise component and summing signal with the first voltage difference through the configuration of switches $S_7$ and $S_8$. As described above, the touch or proximity input is determined relative to a calibration difference without a touch or proximity input.

TABLE 3 illustrates an example sequence of operations for the example self-capacitance measurement using dual reference voltages illustrated in FIGS. 9A-C. Steps 2-4 apply the pre-determined amount of charge to measurement capacitance $C_X$ that modifies the voltage at measurement capacitance $C_X$ to the charging voltage level. As described above, the charging voltage level depends in part on whether a touch or proximity input is present on the electrode of the touch sensor. Steps 4-5 measures the amount of charge modifying the voltage at measurement capacitance $C_X$ from the charging voltage level to reference voltage level $V_{REF2}$, as described above. Steps 6-7 apply the pre-determined amount of charge to measurement capacitance $C_X$ that modifies the voltage at measurement capacitance $C_X$ to the second charging voltage level.

Steps 8-9 measures the amount of charge modifying the voltage at measurement capacitance $C_X$ from the second charging voltage level to reference voltage level $V_{REF1}$. In particular embodiments, steps 2-9 are performed a number of times corresponding to a burst length. Repetition of applying the pre-determined amount of charge on measurement capacitance $C_X$ and transferring charge to sampling capacitor $C_S$ increases the amount of charge on sampling capacitor $C_S$. Although this disclosure describes and illustrates a particular sequence of steps in TABLE 3, this disclosure contemplates any suitable sequence of steps for performing self-capacitance measurements with LF noise suppression using dual reference voltage levels.

TABLE 3

| Step | $S_1$ | $S_2$ | $S_3$ | $S_4$ | $S_5$ | $S_6$ | $S_7$ | $S_8$ | $S_9$ | Description |
|---|---|---|---|---|---|---|---|---|---|---|
| 1 | off | off | off | on | off | on | 1 | 1 | 2 | Initial discharge state-sampling capacitor $C_S$ discharged |
| 2 | off | off | on | on | off | off | 1 | 1 | 2 | Couple current source to measurement capacitance $C_X$ and allow current to settle |
| 3 | off | off | on | off | off | off | 1 | 1 | 2 | Apply current to measurement capacitance $C_X$ for pre-determined amount of time |
| 4 | off | off | off | off | on | off | 1 | 1 | 2 | Integrating charge from charging voltage level to reference voltage level $V_{REF2}$ |
| 5 | off | off | off | off | off | off | 1 | 1 | 2 | End of charge integration |
| 6 | off | on | off | off | off | off | 1 | 1 | 1 | Apply second current to measurement capacitance $C_X$ for second pre-determined amount of time |
| 7 | off | off | off | off | off | off | 2 | 2 | 1 | Switch polarity of integrator circuit |
| 8 | off | off | off | off | on | off | 2 | 2 | 1 | Integrating charge from second charging voltage level to reference voltage level $V_{REF1}$ |
| 9 | off | off | off | off | off | off | 2 | 2 | 1 | End of charge integration; measure output of integrator circuit |
| 10 | off | off | off | on | off | on | 1 | 1 | 2 | Discharge all capacitors | on = closed switch
off = open switch

Figure 10:
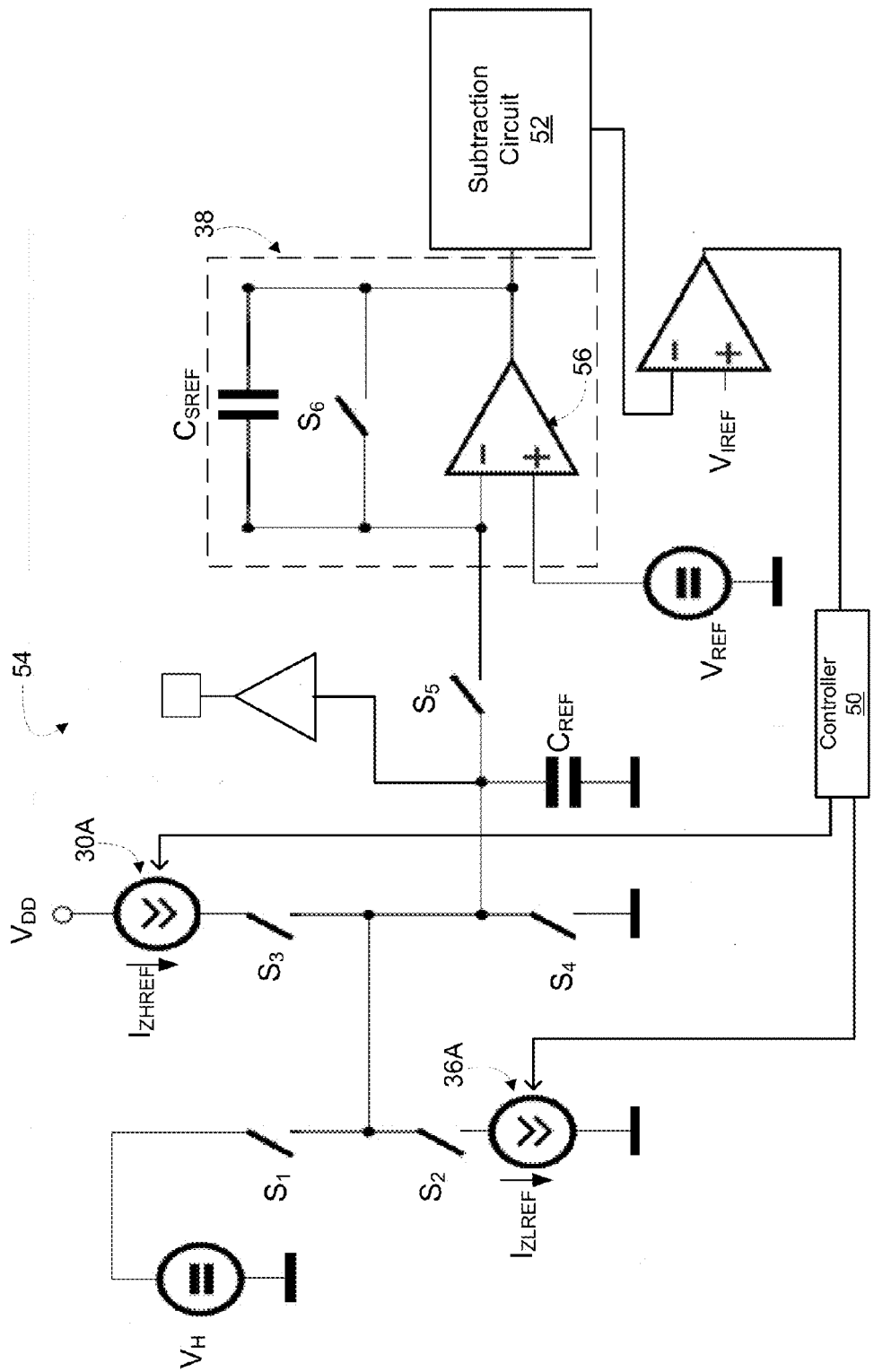
FIG. 10 illustrates an example circuit schematic of a reference circuit for self-capacitance measurements.

FIG. 10 illustrates an example circuit schematic of a reference circuit for self-capacitance measurements. In particular embodiments, the currents used to provide the pre-determined amounts of charge to measurement capacitance $C_X$ may have variation due to temperature, etc. As described above, the charging voltage levels of the self-capacitance measurements are determined at least in part by the pre-determined amount of charge applied on measurement capacitance $C_X$. Variation in the pre-determined amount of charge may lead to variations in the voltage charging levels. Determination of the presence of a touch or proximity input may effected by variations in the charging voltage levels. In particular embodiments, the pre-determined currents $I_{ZH}$ and $I_{ZL}$ may be a function of reference currents $I_{ZHREF}$ and $I_{ZLREF}$, respectively.

Reference bias circuit 54 includes reference capacitor $C_{REF}$ that has a pre-determined value and is coupled to voltage source $V_H$ or reference current source 36A through switches $S_1$ and $S_2$, respectively. Reference capacitor $C_{REF}$ is also coupled to a second reference current source 30A or ground through switches $S_3$ and $S_4$, respectively. In particular embodiments, reference current source 30A and reference current source 36A are configured to generate reference currents $I_{ZHREF}$ and $I_{ZLREF}$, respectively. Switch $S_5$ couples reference capacitor $C_{REF}$ to integrator circuit 38. As an example and not by way of limitation, the capacitance of reference capacitor $C_{REF}$ models the capacitance of the measurement capacitance without a touch or proximity input at the electrode of the touch sensor. One terminal of a reference sampling capacitor $C_{SREF}$ is coupled to the negative input of op-amp 56 of integrator circuit 38 and the other terminal of reference sampling capacitor $C_{SREF}$ is coupled to the output of op-amp 56. Switch $S_6$ couples one terminal of reference sampling capacitor $C_{SREF}$ to the other terminal. The output of integrator circuit 38 is coupled to an input to subtraction circuit 52 that is configured to subtract two voltage differences. The negative terminal of op-amp 56 is coupled to subtraction circuit 52. The positive terminal op-amp 56 is coupled to reference voltage level $V_{IREF}$ and the output of op-amp 56 is coupled to a controller 50. Controller 50 is coupled to current sources 30A and 36A. In particular embodiments, controller 50 may be a proportional-integral-derivative (PID) controller. Although this disclosure describes and illustrates a particular arrangement of particular components for the reference bias circuit and integrator circuit, this disclosure contemplates any suitable arrangement of any suitable components for the reference bias circuit and integrator circuit.

In particular embodiments, reference circuit 54 operates in a similar fashion to the self-capacitance measurement circuit with LF noise suppression described above. The amount of charge of reference capacitor $C_{REF}$ is modified by closing switch $S_4$ and resulting in the voltage at reference capacitor $C_{REF}$ being ground. A pre-determined amount of charge is applied to reference capacitor $C_{REF}$ by closing switch $S_3$, resulting in the voltage at reference capacitor $C_{REF}$ being a charging voltage level. Closing switch S5 transfers charge between reference capacitor $C_{REF}$ and reference sampling capacitor $C_{SREF}$ resulting in the voltage at reference capacitor $C_{REF}$ being reference voltage level $V_{REF}$. The difference between the charging voltage level and reference voltage level $V_{REF}$ is stored by subtraction circuit 52.

The amount of charge of reference capacitor $C_{REF}$ is modified by closing switch $S_1$ and resulting in the voltage at reference capacitor $C_{REF}$ being $V_H$. A second pre-determined amount of charge is applied to reference capacitor $C_{REF}$ by closing switch $S_2$, resulting in the voltage at reference capacitor $C_{REF}$ being modified from $V_H$ to a second charging voltage level. Closing switch S5 transfers charge between reference capacitor $C_{REF}$ and sampling capacitor $C_{SREF}$ resulting in the voltage at reference capacitor $C_{REF}$ being reference voltage level $V_{REF}$. The second difference between the charging voltage level and reference voltage level $V_{REF}$ is subtracted from the stored first difference by subtraction circuit 52. As an example and not by way of limitation, the output of subtraction circuit 52 may be used as the calibration difference without a touch or proximity input described above.

Figure 11:
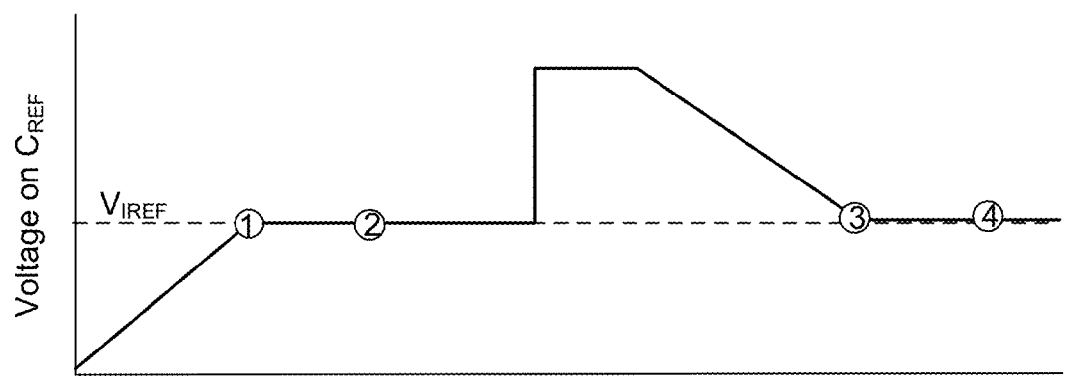
FIG. 11 illustrates a voltage at a reference capacitor of the example reference bias circuit over time.

FIG. 11 illustrates a voltage at a reference capacitor of the example reference bias circuit over time. In the example of FIG. 11, reference voltage level $V_{IREF}$ of the reference circuit is substantially equal to the reference voltage level $V_{REF}$ of the self-capacitance measurement circuit. In particular embodiments, reference currents $I_{ZHREF}$ and $I_{ZLREF}$ may be configured to be equal to each other, such that the difference between the first charging voltage level and the reference voltage level $V_{REF}$ is equal to the difference between the second charging voltage level and the reference voltage level $V_{REF}$. Any offset between the two voltage differences is transmitted to the op-amp and compared with reference voltage level $V_{IREF}$ on the positive input of the op-amp. In particular embodiments, the op-amp is configured to transmit a signal indicating the offset between the voltage differences and reference voltage level $V_{IREF}$.

The controller of the example reference bias circuit recursively adjusts reference currents $I_{ZHREF}$ and $I_{ZLREF}$, such that the voltage differences are within an error bound of reference voltage level $V_{IREF}$. In other words, the voltage differences are within reference voltage level $V_{IREF} \pm \delta$, where $\delta$ is a small voltage value. As an example and not by way of limitation, reference currents $I_{ZHREF}$ and $I_{ZLREF}$ are recursively adjusted, such that the charging voltage levels at time points 2 and 6 are substantially equal to the reference voltage $V_{IREF}$. In the example of FIG. 11, the voltage at reference capacitor $C_{REF}$ is substantially equal to reference voltage $V_{IREF}$ between time points 1 and 2 and between time points 3 and 4. Adjusting reference currents $I_{ZHREF}$ and $I_{ZLREF}$ may in turn adjust currents $I_{ZH}$ and $I_{ZL}$ of the example differential self-capacitance measurement circuit of FIG. 6, such that the charging voltage levels of differential self-capacitance measurement circuit are substantially equal to the reference voltage without a touch or proximity input. After adjustment of currents $I_{ZH}$ and $I_{ZL}$, modulation of the voltage at the measurement capacitance of the example differential self-capacitance measurement circuit from the reference voltage is substantially due to a touch or proximity input occurring at the electrode of the touch sensor.

Figure 12:
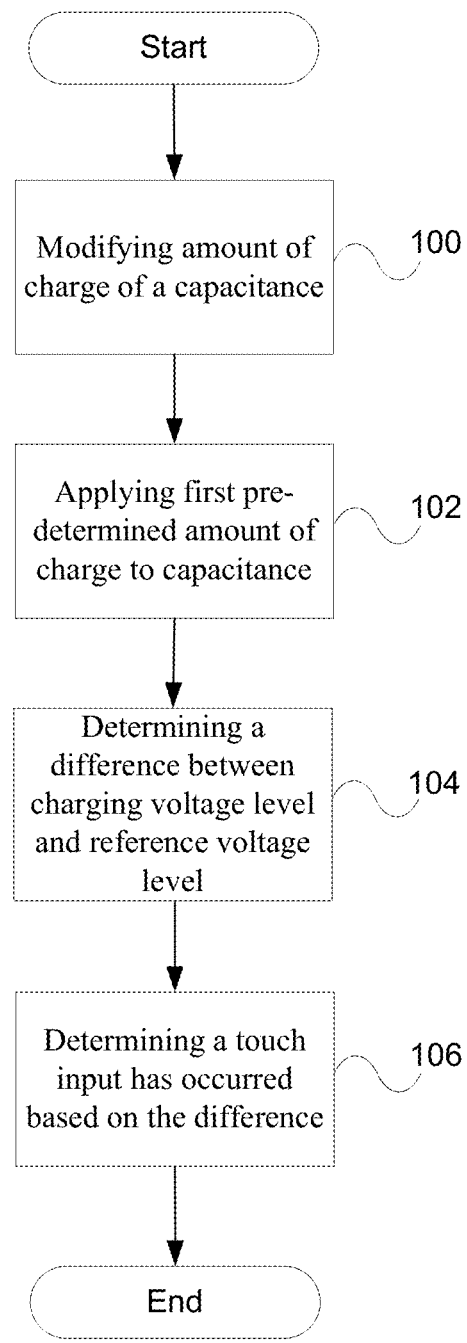
FIG. 12 illustrates an example method for self-capacitance measurements.

FIG. 12 illustrates an example method for self-capacitance measurements. The method may start at step 100, where an amount of charge of a capacitance of a touch sensor is modified. The modified amount of charge resulting in a voltage at the capacitance being a first pre-determined voltage level. In particular embodiments, the first pre-determined voltage is ground. Step 102 applies a first pre-determined amount of charge to the capacitance. The application of the first pre-determined amount of charge modifies the voltage at the capacitance from the first pre-determined voltage level to a first charging voltage level. In particular embodiments, the pre-determined amount of charge is generated by applying a pre-determined current to the capacitor for a pre-determined amount of time. In step 104, a first difference between the first charging voltage level and a reference voltage level is determined. In particular embodiments, the reference voltage level is half a power supply voltage. At step 106, where whether a touch input to the touch sensor has occurred is determined based on the first difference, at which point the method may end. The first charging voltage level is due at least in part on whether a touch or proximity input at the touch sensor has occurred. Although this disclosure describes and illustrates particular steps of the method of FIG. 12 as occurring in a particular order, this disclosure contemplates any suitable steps of the method of FIG. 12 occurring in any suitable order. Moreover, although this disclosure describes and illustrates particular components carrying out particular steps of the method of FIG. 12, this disclosure contemplates any suitable combination of any suitable components carrying out any suitable steps of the method of FIG. 12.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:

modifying an amount of charge of a measurement capacitance of a touch sensor, the modified amount of charge resulting in a voltage at the measurement capacitance being a first pre-determined voltage level;

applying charge to an electrode associated with the measurement capacitance resulting in a first pre-determined amount of charge on the measurement capacitance, the application of the charge to the electrode resulting in the first pre-determined amount of charge on the measurement capacitance modifying the voltage at the measurement capacitance from the first pre-determined voltage level to a first charging voltage level;

transferring a portion of the charge on the measurement capacitance to a sampling capacitance such that a voltage level of the sampling capacitance increases as a function of a first difference between the first charging voltage level resulting from the first pre-determined amount of charge and a reference voltage level, and such that the voltage at the measurement capacitance is modified from the first charging voltage level to the reference voltage level, wherein the reference voltage level is a pre-determined voltage corresponding to the voltage obtained by applying the first pre-determined amount of charge to the electrode when a touch input has not occurred;

measuring the first difference between the first charging voltage level resulting from the first pre-determined amount of charge and the reference voltage level by measuring the voltage level of the sampling capacitance; and determining whether a touch input to the touch sensor has occurred based at least in part on the voltage level of the sampling capacitance.

2. The method of claim 1, further comprising:

modifying the amount of charge of the capacitance, the modified amount of charge resulting in the voltage at the capacitance being a second pre-determined voltage level;

applying a second pre-determined amount of charge to the capacitance, the application of the second pre-determined amount of charge to the capacitance modifying the voltage at the capacitance from the second pre-determined voltage level to a second charging voltage level;

determining a second difference between the second charging voltage level and the reference voltage level; and determining whether a touch input to the touch sensor has occurred based on the first and second differences.

3. The method of claim 1, wherein applying the first pre-determined amount of charge comprises:

applying a portion of the first pre-determined amount of charge with a first pre-determined current for a first pre-determined amount of time; and applying another portion of the first pre-determined amount of charge with a second pre-determined current for a second pre-determined amount of time, the second pre-determined current being larger than the first pre-determined current.

4. The method of claim 1, wherein applying the pre-determined amount of charge comprising applying a pre-determined current for a pre-determined amount of time, the pre-determined current is a function of a reference current.

5. The method of claim 4, further comprising periodically adjusting the pre-determined amount of time based on the first difference.

6. The method of claim 4, wherein further comprising periodically adjusting the reference current based on the first difference.

7. The method of claim 1, further comprising:

applying a second pre-determined amount of charge to the capacitance, the application of the second pre-determined amount of charge to the capacitance modifying the voltage at the capacitance from the reference voltage level to a second charging voltage level;

determining a second difference between the second charging voltage level and a second pre-determined voltage level; and determining whether a touch input to the touch sensor has occurred based on the first and second differences.

8. A computer-readable non-transitory storage medium embodying logic configured when executed to:

modify an amount of charge of a measurement capacitance of a touch sensor, the modified amount of charge resulting in a voltage at the measurement capacitance being a first pre-determined voltage level;

apply charge to an electrode associated with the measurement capacitance resulting, in a first pre-determined amount of charge on the measurement capacitance, the application of the charge to the electrode resulting in the first pre-determined amount of charge on the measurement capacitance modifying the voltage at the measurement capacitance from the first pre-determined voltage level to a first charging voltage level;

transfer a portion of the charge on the measurement capacitance to a sampling capacitance such that a voltage level of the sampling capacitance increases as a function of a first difference between the first charging voltage level resulting from the first pre-determined amount of charge and a reference voltage level, and such that the voltage at the measurement capacitance is modified from the first charging voltage level to the reference voltage level, wherein the reference voltage level is a pre-determined voltage corresponding to the voltage obtained by applying the first pre-determined amount of charge to the electrode when a touch input has not occurred;

measure the first difference between the first charging voltage level resulting from the first pre-determined amount of charge and the reference voltage level by measuring the voltage level of the sampling capacitance; and determine whether a touch input to the touch sensor has occurred based at least in part on the voltage level of the sampling capacitance.

9. The medium of claim 8, wherein the logic is further configured to:

modify the amount of charge of the capacitance, the modified amount of charge resulting in the voltage at the capacitance being a second pre-determined voltage level;

apply a second pre-determined amount of charge to the capacitance, the application of the second pre-determined amount of charge to the capacitance modifying the voltage at the capacitance from the second pre-determined voltage level to a second charging voltage level;

determine a second difference between the second charging voltage level and the reference voltage level; and determine whether a touch input to the touch sensor has occurred based on the first and second differences.

10. The medium of claim 8, wherein the logic is further configured to:

apply a portion of the first pre-determined amount of charge with a first pre-determined current for a first pre-determined amount of time; and apply another portion of the first pre-determined amount of charge with a second pre-determined current for a second pre-determined amount of time, the second pre-determined current being larger than the first pre-determined current.

11. The medium of claim 8, wherein the logic is further configured to apply a pre-determined current for a pre-determined amount of time, the pre-determined current is a function of a reference current.

12. The medium of claim 11, wherein the logic is further configured to periodically adjust the pre-determined amount of time based on the first difference.

13. The medium of claim 11, wherein the logic is further configured to periodically adjust the reference current based on the first difference.

14. The medium of claim 8, wherein the logic is further configured to:

apply a second pre-determined amount of charge to the capacitance, the application of the second pre-determined amount of charge to the capacitance modifying the voltage at the capacitance from the reference voltage level to a second charging voltage level;

determine a second difference between the second charging voltage level and a second pre-determined voltage level; and determine whether a touch input to the touch sensor has occurred based on the first and second differences.

15. A device comprising:

a measurement circuit; and a computer-readable non-transitory storage medium coupled to the measurement circuit and embodying logic configured when executed to:

modify an amount of charge of a measurement capacitance of a touch sensor, the modified amount of charge resulting in a voltage at the measurement capacitance being a first pre-determined voltage level;

apply charge to an electrode associated with the measurement capacitance resulting in a first pre-determined amount of charge on the measurement capacitance, the application of the charge to the electrode resulting in the first pre-determined amount of charge on the measurement capacitance modifying the voltage at the measurement capacitance from the first pre-determined voltage level to a first charging voltage level;

transfer a portion of the charge on the measurement capacitance to a sampling capacitance such that a voltage level of the sampling capacitance increases as a function of a first difference between the first charging voltage level resulting from the first pre-determined amount of charge and a reference voltage level, and such that the voltage at the measurement capacitance is modified from the first charging voltage level to the reference voltage level, wherein the reference voltage level is a pre-determined voltage corresponding to the voltage obtained by applying the first pre-determined amount of charge to the electrode when a touch input has not occurred;

measure the first difference between the first charging voltage level resulting from the first pre-determined amount of charge and the reference voltage level by measuring the voltage level of the sampling capacitance; and determine whether a touch input to the touch sensor has occurred based at least in part on the voltage level of the sampling capacitance.

16. The device of claim 15, wherein the logic is further configured to:

modify the amount of charge of the capacitance, the modified amount of charge resulting in the voltage at the capacitance being a second pre-determined voltage level;

apply a second pre-determined amount of charge to the capacitance, the application of the second pre-determined amount of charge to the capacitance modifying the voltage at the capacitance from the second pre-determined voltage level to a second charging voltage level;

determine a second difference between the second charging voltage level and the reference voltage level; and determine whether a touch input to the touch sensor has occurred based on the first and second differences.

17. The device of claim 15, wherein the logic is further configured to:

apply a portion of the first pre-determined amount of charge with a first pre-determined current for a first pre-determined amount of time; and apply another portion of the first pre-determined amount of charge with a second pre-determined current for a second pre-determined amount of time, the second pre-determined current being larger than the first pre-determined current.

18. The device of claim 15, wherein the logic is further configured to apply a pre-determined current for a pre-determined amount of time, the pre-determined current is a function of a reference current.

19. The device of claim 18, wherein the logic is further configured to periodically adjust the reference current based on the first difference.

20. The device of claim 15, wherein the logic is further configured to:

apply a second pre-determined amount of charge to the capacitance, the application of the second pre-determined amount of charge to the capacitance modifying the voltage at the capacitance from the reference voltage level to a second charging voltage level;

determine a second difference between the second charging voltage level and a second pre-determined voltage level; and determine whether a touch input to the touch sensor has occurred based on the first and second differences.

21. The method of claim 1, wherein determining whether a touch input to the touch sensor has occurred comprises comparing a value of an output voltage that is proportional to the first difference to a value of the output voltage without a touch input.

* * * * *